(12) United States Patent
Li

(10) Patent No.: US 9,917,278 B2
(45) Date of Patent: Mar. 13, 2018

(54) ARRAY SUBSTRATE, ORGANIC ELECTROLUMINESCENT DISPLAY PANEL AND DISPLAY APPARATUS

(71) Applicants: BOE Technology Group Co., Ltd., Beijing (CN); Hefei BOE Optoelectronics Technology Co., Ltd., Anhui (CN)

(72) Inventor: Yajun Li, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 15/150,613

(22) Filed: May 10, 2016

(65) Prior Publication Data

US 2017/0077446 A1    Mar. 16, 2017

(30) Foreign Application Priority Data

Sep. 10, 2015  (CN) .......................... 2015 1 0575237

(51) Int. Cl.
*H01L 29/08* (2006.01)
*H01L 51/52* (2006.01)
*H01L 51/00* (2006.01)

(52) U.S. Cl.
CPC ...... *H01L 51/5253* (2013.01); *H01L 51/5259* (2013.01); *H01L 51/007* (2013.01);
(Continued)

(58) Field of Classification Search
CPC ............. H01L 51/5253; H01L 51/5259; H01L 2251/0063; H01L 51/0067; H01L 51/0073; H01L 51/0059; H01L 51/0077; H01L 51/0072; H01L 51/035; H01L 51/0036; H01L 51/0039
(Continued)

(56) References Cited

U.S. PATENT DOCUMENTS

| 7,982,397 B2 * | 7/2011 | Choi | H01L 51/5259 |
| | | | 313/506 |
| 9,601,721 B2 * | 3/2017 | Lang | H01L 51/524 |
| 2011/0127570 A1 * | 6/2011 | Um | H01L 51/524 |
| | | | 257/100 |
| 2014/0246665 A1 | 9/2014 | Lang et al. | |
| 2015/0001508 A1 * | 1/2015 | Lee | H01L 51/5253 |
| | | | 257/40 |
| 2016/0268548 A1 * | 9/2016 | Yu | H01L 51/52 |

FOREIGN PATENT DOCUMENTS

| CN | 1652646 A | 8/2005 |
| CN | 1909263 A | 2/2007 |

(Continued)

OTHER PUBLICATIONS

English machine translation of Chinese Patent CN1652646(A) date Aug. 2005 assigned to Su et al.*

(Continued)

*Primary Examiner* — Thinh T Nguyen
(74) *Attorney, Agent, or Firm* — Banner & Witcoff, Ltd.

(57) ABSTRACT

Disclosed are an array substrate, an organic electroluminescent display panel and a display apparatus. The array substrate includes: a base substrate, an organic electroluminescent structure disposed on the base substrate, a thin film packaging layer covering the organic electroluminescent structure, and an adsorption layer disposed on the thin film packaging layer.

16 Claims, 3 Drawing Sheets

(52) U.S. Cl.
CPC ...... *H01L 51/0035* (2013.01); *H01L 51/0036* (2013.01); *H01L 51/0039* (2013.01); *H01L 51/0053* (2013.01); *H01L 51/0059* (2013.01); *H01L 51/0067* (2013.01); *H01L 51/0072* (2013.01); *H01L 51/0073* (2013.01); *H01L 51/0077* (2013.01); *H01L 2051/0063* (2013.01); *H01L 2251/558* (2013.01)

(58) Field of Classification Search
USPC ........ 257/40, 59, 72, 704, 687; 438/125, 82, 438/99
See application file for complete search history.

(56) References Cited

FOREIGN PATENT DOCUMENTS

| | | |
|---|---|---|
| CN | 101866944 A | 10/2010 |
| CN | 103875090 A | 6/2014 |
| CN | 104269497 A | 1/2015 |

OTHER PUBLICATIONS

Aug. 31, 2016—(CN)—First Office Action Appn 201510575237.7 with English Tran.
Feb. 15, 2017—(CN) Second Office Action Appn 201510575237.7 with English Tran.

\* cited by examiner

US 9,917,278 B2

ARRAY SUBSTRATE, ORGANIC ELECTROLUMINESCENT DISPLAY PANEL AND DISPLAY APPARATUS

This application claims priority to and the benefit of Chinese Patent Application No. 201510575237.7 filed on Sep. 10, 2015, which application is incorporated herein in its entirety.

TECHNICAL FIELD

Embodiments of the present disclosure relate to an array substrate, an organic electroluminescent display panel and a display apparatus.

BACKGROUND

Currently, organic electroluminescent displays (OLED) have enjoyed the most popularity in the display field owing to their excellent properties such as low power consumption, high color saturation, wide viewing angle, small thickness, and the ability to achieve flexibility. Current OLED devices have a service life of over 100,000 h and a storage life of over 50,000 h, which are yet relatively shorter than that of liquid crystal displays and plasma displays. This, as a consequence, still serves as one of the significant factors restricting commercialization of OLED.

Ingredients such as water vapor and oxygen in air greatly affect the life of OLED due to the following reasons: firstly, during operation of an OLED device, electrons are injected from cathode, which requires the work function of the cathode to be as low as possible; however, the metal materials for making cathode such as aluminum, magnesium, calcium and the like, generally have active chemical properties, and therefore are susceptible to erosion in air or in other oxygen-containing environments, especially to electrochemical erosion in an environment containing water vapor; secondly, oxygen and water vapor may further chemically react with organic functional layers in OLED such as light-emitting layers, hole transport layers and electron transport layers, which will deactivate the OLED device.

SUMMARY

Embodiments of the present disclosure provide an array substrate, comprising: a base substrate, an organic electroluminescent structure disposed on the base substrate, and a thin film packaging layer covering the organic electroluminescent structure; further comprising:

an adsorption layer disposed on the thin film packaging layer for adsorbing water vapor and oxygen.

In some embodiments, the adsorption layer comprises an organic material layer and a cathode material layer which are laminated.

In some embodiments, the material of the organic material layer is the same as the material of the organic functional layer in the organic electroluminescent structure; and/or the material of the cathode material layer is the same as the material of the cathode layer in the organic electroluminescent structure.

Embodiments of the present disclosure further provide an organic electroluminescent display panel, comprising the above array substrate according to embodiments of the present disclosure.

Embodiments of the present disclosure further provide a display apparatus, comprising the above organic electroluminescent display panel according to embodiments of the present disclosure.

BRIEF DESCRIPTION OF THE DRAWINGS

In order to clearly illustrate the technical solutions of the embodiments of the present disclosure, the drawings of the embodiments are briefly described below. Apparently, the drawings described below relate to only some embodiments of the present disclosure and thus are not limitative of the present disclosure.

DETAILED DESCRIPTION

To make clearer the objects, technical solutions and advantages of the embodiments of the present disclosure, a clear and full description of the technical solutions of the embodiments of the present disclosure will be made with reference to the accompanying drawings of the embodiments of the present disclosure. Apparently, the described embodiments are just part rather than all of the embodiments of the present disclosure. Based on the embodiments of the present disclosure described, all the other embodiments obtained by a person of ordinary skill in the art, without any creative labor, fall within the scope of protection of the present disclosure.

Figure 1:
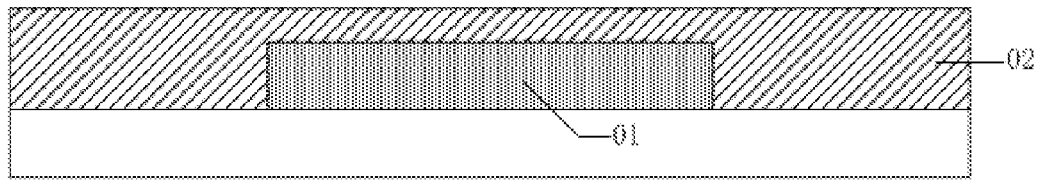
FIG. 1 is a schematic structural view of an array substrate.

In order to separate various functional layers of an OLED device from ingredients such as water vapor and oxygen in air so as to extend the life of the device, as shown in FIG. 1, a thin film packaging layer 02 is typically covered on the OLED device 01. The preparation processes of the thin film packaging layer 02 may include a variety of processes such as inorganic film packaging, organic film packaging, inorganic-organic film composite packaging, etc., which inevitably involve thin film defects, such as vacancies, layer defects and impurities, have poor barrier ability to water vapor and oxygen, and can be easily penetrated by oxygen and water vapor, thereby affecting the life of the OLED device.

Embodiments of the present disclosure provide an array substrate, an organic electroluminescent display panel and a display apparatus, which can adsorb water vapor and oxygen in air, prevent water vapor and oxygen from entering the organic electroluminescent structure, thereby effectively protecting the organic electroluminescent structure and extending its life.

Therefore, embodiments of the present disclosure provide an array substrate, comprising: a base substrate, an organic electroluminescent structure disposed on the base substrate, and a thin film packaging layer covering the organic electroluminescent structure; further comprising:

an adsorption layer disposed on the thin film packaging layer for adsorbing water vapor and oxygen.

In some embodiments, for example, the adsorption layer comprises an organic material layer and a cathode material layer which are laminated.

In some embodiments, for example, the material of the organic material layer is the same as the material of the organic functional layer in the organic electroluminescent structure; and/or the material of the cathode material layer is the same as the material of the cathode layer in the organic electroluminescent structure.

In some embodiments, for example, the organic material layer has a thickness of 50 nm to 1000 nm.

In some embodiments, for example, the cathode material layer has a thickness of 50 nm to 1000 nm.

In some embodiments, for example, the array substrate may further comprise an isolation layer disposed on the adsorption layer for isolating water vapor and oxygen.

In some embodiments, for example, the material of the isolation layer is the same as the material of the thin film packaging layer.

In some embodiments, for example, the isolation layer has a thickness of 50 nm to 1000 nm.

Embodiments of the present disclosure further provide an organic electroluminescent display panel, comprising the above array substrate according to embodiments of the present disclosure.

Embodiments of the present disclosure further provide a display apparatus, comprising the above organic electroluminescent display panel according to embodiments of the present disclosure.

The array substrate according to embodiments of the present disclosure adsorbs the water vapor and oxygen in air using an adsorption layer, which prevents water vapor and oxygen from entering the organic electroluminescent structure, thereby effectively protecting the organic electroluminescent structure and extending its life.

Embodiments of the array substrate, organic electroluminescent display panel and display apparatus according to embodiments of the present disclosure are illustrated in detail below in combination with the drawings.

The thicknesses and shapes of the various film layers in the drawings do not reflect the true proportion of the array substrate, but merely aim to illustrate the content of the present disclosure.

Figure 2:
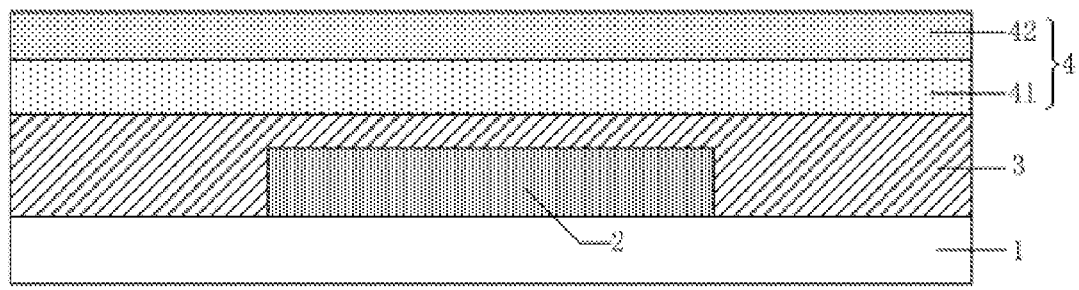
FIG. 2 is a first schematic structural view of an array substrate according to an embodiment of the present disclosure.

Embodiments of the present disclosure provide an array substrate, as shown in FIG. 2, comprising: a base substrate 1, an organic electroluminescent structure 2 disposed on the base substrate 1, and a thin film packaging layer 3 covering the organic electroluminescent structure 2; the array substrate further comprising: an adsorption layer 4 disposed on the thin film packaging layer 3 for adsorbing water vapor and oxygen.

In the above array substrate according to embodiments of the present disclosure, an adsorption layer may be used to adsorb the water vapor and oxygen in air, which prevents water vapor and oxygen from entering the organic electroluminescent structure, thereby effectively protecting the organic electroluminescent structure and extending its life.

In the above array substrate according to embodiments of the present disclosure, in order to better ensure that the adsorption layer can fully adsorb water vapor and oxygen, as shown in FIG. 2, in one embodiment, the adsorption layer 4 may comprise an organic material layer 41 and a cathode material layer 42 which are laminated (it shall be noted that the positions of the organic material layer and the cathode material layer are interchangeable). The material of the cathode material layer is typically a metal material with quite active chemical properties, which may easily react with the oxygen and water vapor penetrated, and the organic material of the organic material layer is also readily susceptible to oxidation with oxygen and to hydrolysis with water vapor. Therefore, the organic material layer and the cathode material layer which are laminated can adsorb water vapor and oxygen more fully. The material of the organic material layer 41 can be selected from the group consisting of oxadiazole and derivatives thereof, triazole and derivatives thereof, rhodamine and derivatives thereof, coumarin and derivatives thereof, 1,8-naphthalimide and derivatives thereof, pyrazoline and derivatives thereof, triphenylamine and derivatives thereof, porphyrin and derivatives thereof, carbazole and derivatives thereof, pyrazine and derivatives thereof, thiazole and derivatives thereof, perylene and derivatives thereof; polyphenylene, polythiophene, polyfluorene, polytriphenylamine and derivatives thereof; the material of the organic material layer 41 can also be selected from the group consisting of polytriphenylamine, polycarbazole, polypyrrole, polyporphyrin and derivatives and copolymers thereof. The material of the cathode material layer may be selected from one of silver (Ag), aluminum (Al), lithium (Li), magnesium (Mg), calcium (Ca), indium (In), or a combination thereof.

Furthermore, upon specific implementation, in the above array substrate according to embodiments of the present disclosure, the material of the organic material layer is the same as the material of the organic functional layer in the organic electroluminescent structure; and/or the material of the cathode material layer is the same as the material of the cathode layer in the organic electroluminescent structure. As such, the material of the adsorption layer directly employs the material of the organic functional layer and the cathode layer in the organic electroluminescent structure without the need to use a new material, which avoids a further preparation process of a new material and thereby facilitates mass production.

It shall be noted that the organic functional layer in the organic electroluminescent structure may include a hole injection layer, a hole transport layer, an electron blocking layer, an organic light-emitting layer, a hole blocking layer, an electron transport layer, an electron injection layer, etc. The material of the organic material layer in the adsorption layer according to embodiments of the present disclosure may be the same as the material of any of the above organic functional layers, or be the same as the material of the combination of the above various organic functional layers.

Upon specific implementation, in the above array substrate according to embodiments of the present disclosure, in order to effectively adsorb water vapor and oxygen in air, for example, the thickness of the organic material layer may be set as from 50 nm to 1000 nm. Needless to say, the thickness of the organic material layer may be set depending upon actual conditions as long as the requirement that the organic material layer can effectively adsorb water vapor and oxygen is met, and therefore no further definition is made herein.

Upon specific implementation, in the above array substrate according to embodiments of the present disclosure, in order to effectively adsorb water vapor and oxygen in air, for example, the thickness of the cathode material layer may be set as from 50 nm to 1000 nm.

Needless to say, the thickness of the cathode material layer may be set depending upon actual conditions as long as the requirement that the cathode material layer can effectively adsorb water vapor and oxygen is met, and therefore no further definition is made herein.

Figure 3:
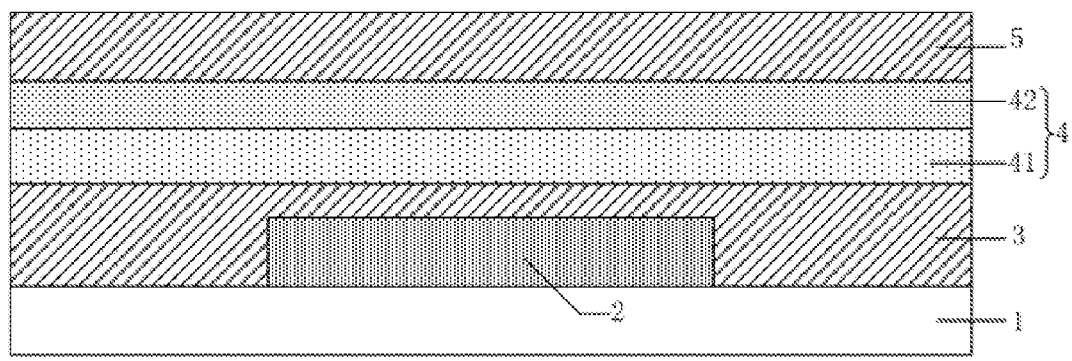
FIG. 3 is a second schematic structural view of an array substrate according to an embodiment of the present disclosure.

Furthermore, upon specific implementation, in the above array substrate according to embodiments of the present disclosure, as shown in FIG. 3, the array substrate may further include: an isolation layer 5 which is disposed on the adsorption layer 4 for isolating water vapor and oxygen. The isolation layer serves to further protect the organic electroluminescent structure, which may isolate the water vapor and oxygen in the ambient air, and to further block penetration of external moisture and oxygen. When some moisture and oxygen still enter from the isolation layer, the adsorption layer can fully adsorb the water vapor and oxygen, thereby undoubtedly achieving the object of preventing external water vapor and oxygen from entering the organic electroluminescent structure.

Upon specific implementation, in the above array substrate according to embodiments of the present disclosure, the materials of the isolation layer and the thin film packaging layer can be the same. As such, the material of the isolation layer directly employs the material of the thin film packaging layer in the array substrate without the need to use a new material, which avoids a further preparation process of a new material and thereby facilitates mass production.

It shall be noted that the material of the thin film packaging layer may be an organic material, an inorganic material or an organic-inorganic composite material. The structure of the thin film packaging layer may be an inorganic film layer structure, an organic thin film layer structure, or a multi-layer film structure of a combination of alternating inorganic thin film layers and organic thin film layers, where the structure of the isolation layer can be the same as that of the thin film packaging layer.

Upon specific implementation, in the above array substrate according to embodiments of the present disclosure, in order to effectively isolate water vapor and oxygen in air, for example, the thickness of the isolation layer may be set as from 50 nm to 1000 nm. Needless to say, the thickness of the isolation layer may be set depending upon actual conditions as long as the requirement that the isolation layer can effectively adsorb water vapor and oxygen is met, and therefore no further definition is made herein.

Upon specific implementation, the organic electroluminescent structure in the array substrate according to embodiments of the present disclosure generally will have other film layer structures such as an organic light-emitting layer, a cathode, an anode and the like, and a structure such as a metal signal line is typically formed on the base substrate, which structures may be achieved in a variety of ways, and no definition will be made herein in this regard.

Figure 4:
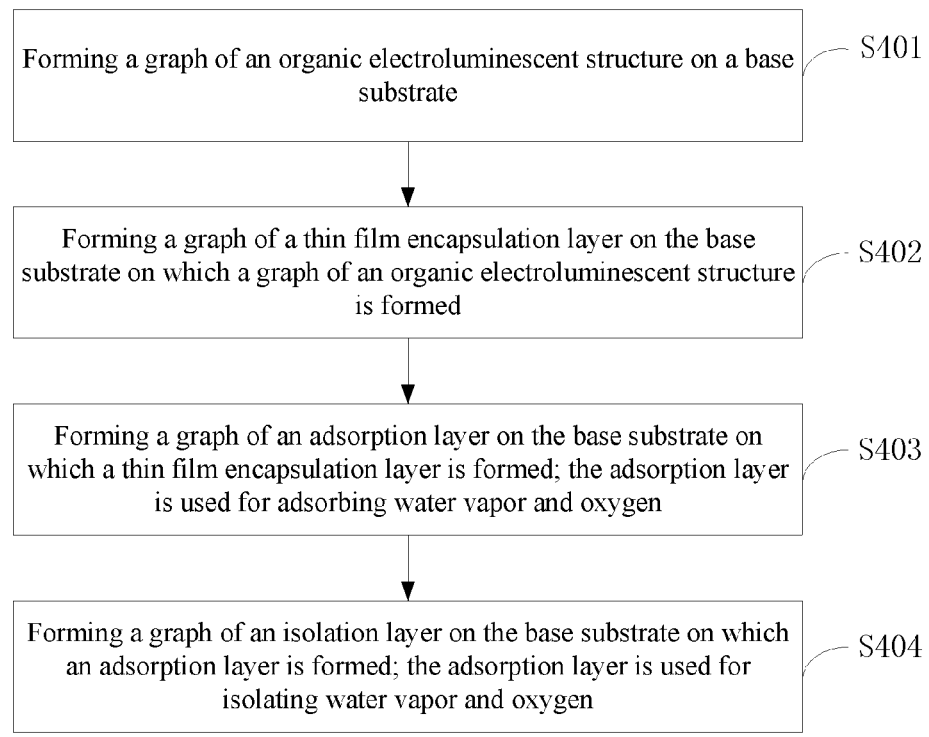
FIG. 4 is a flow chart of a method for preparing an array substrate according to an embodiment of the present disclosure.

The method for making an array substrate according to embodiments of the present disclosure is illustrated below in detail with a specific example. As shown in FIG. 4, the specific steps for making an array substrate are as follows:

S401. A graph of an organic electroluminescent structure is formed on a base substrate.

Figure 5A:
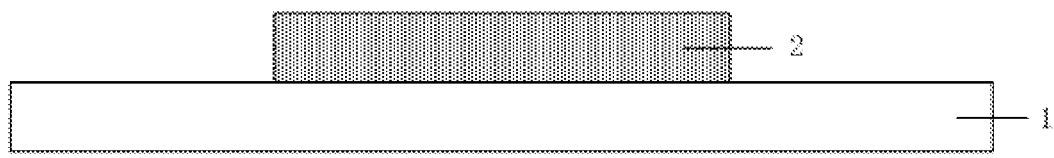
FIGS. 5*a* to 5*d* are respectively schematic structural views of the method for preparing an array substrate according to an embodiment of the present disclosure after various steps have been carried out.

For example, as shown in FIG. 5a, a graph of an organic electroluminescent structure 2 is formed on a base substrate 1; the organic electroluminescent structure 2 may comprise structures such as an anode, a light-emitting layer, a cathode and the like which are laminated.

S402. A graph of a thin film packaging layer is formed on the base substrate on which a graph of an organic electroluminescent structure is formed.

Figure 5B:
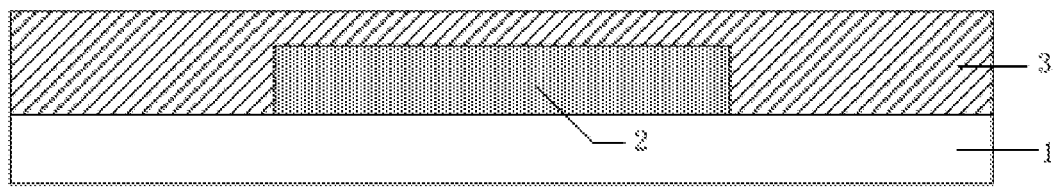

For example, as shown in FIG. 5b, a layer of inorganic thin film, such as $Al_2O_3$, is deposited on the base substrate 1 in Step S401, to be used as a graph of a thin film packaging layer 3; alternatively, a layer of organic thin film is deposited to be used as a graph of a thin film packaging layer; further alternatively, a layer of inorganic thin film, a layer of organic thin film and a layer of inorganic thin film are sequentially deposited to be used as a graph of a thin film packaging layer.

S403. A graph of an adsorption layer is formed on the base substrate on which a thin film packaging layer is formed; the adsorption layer is used for adsorbing water vapor and oxygen.

Figure 5C:
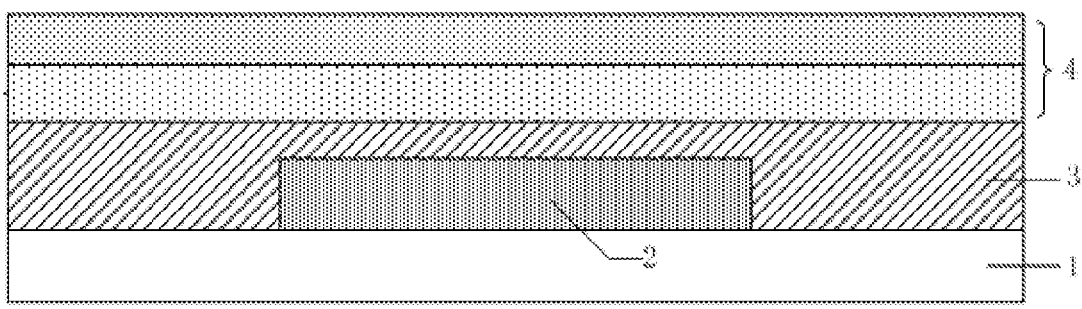

For example, as shown in FIG. 5c, a layer of organic material thin film and a layer of cathode material thin film are sequentially deposited on the base substrate 1 on which a thin film packaging layer 3 is formed in step S402, the two layers of thin film being used as graphs of the adsorption layer 4.

S404. A graph of an isolation layer is formed on the base substrate on which an adsorption layer is formed; the isolation layer is used for isolating water vapor and oxygen.

Figure 5D:
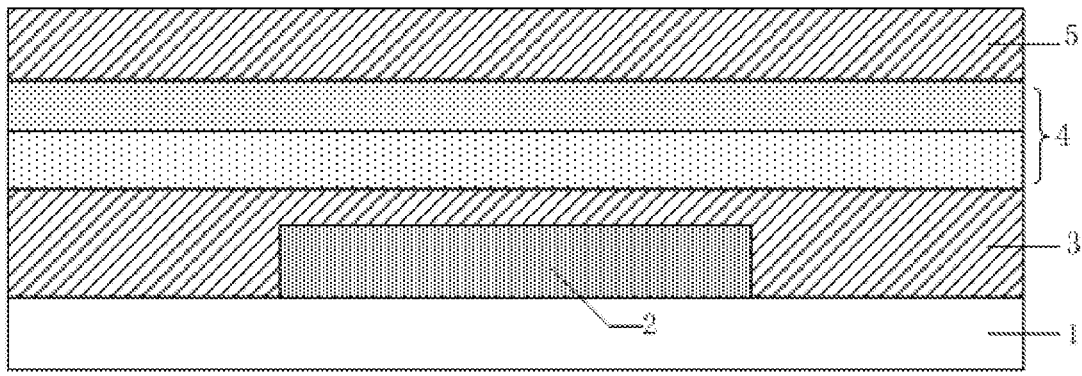

For example, as shown in FIG. 5d, a layer of inorganic thin film, such as $Al_2O_3$, is deposited on the base substrate 1 on which an adsorption layer 4 is formed in Step S403, to be used as a graph of an isolation layer 5; alternatively, a layer of organic thin film is deposited as the graph of the isolation layer; further alternatively, a layer of inorganic thin film, a layer of organic thin film, and a layer of inorganic thin film are sequentially deposited to be used as the graph of the isolation layer.

To this end, the above array substrate according to embodiments of the present disclosure is made by the above steps S401 to S404 provided by the aforesaid specific example.

Embodiments of the present disclosure further provide an organic electroluminescent display panel, comprising the above array substrate according to embodiments of the present disclosure.

Embodiments of the present disclosure further provide a display apparatus, comprising the above organic electroluminescent display panel according to embodiments of the present disclosure. The display apparatus can be any product or part having display functions such as a mobile phone, a tablet computer, a TV set, a display, a laptop, a digital photo frame, or a navigator. As to the other essential components of the display apparatus, they shall be understood by one of ordinary skill in the art, for which no detail is provided herein and which shall not serve to limit the present disclosure. As to the implementation of the display apparatus, reference may be made to the above array substrate and organic electroluminescent display panel, where no further detail is provided concerning repetition.

Embodiments of the present disclosure provide an array substrate, an organic electroluminescent display panel and a display apparatus. The array substrate comprises: a base substrate, an organic electroluminescent structure disposed on the base substrate, and a thin film packaging layer covering the organic electroluminescent structure; and further comprises an adsorption layer disposed on the thin film packaging layer for adsorption water vapor and oxygen. The array substrate according to embodiments of the present disclosure uses an adsorption layer to adsorb water vapor and oxygen in air, which prevents water vapor and oxygen from entering the organic electroluminescent structure, thereby effectively protecting the organic electroluminescent structure and extending its life.

The above are merely exemplary embodiments of the present disclosure, and are not intended to limit the scope of protection of the present disclosure, which is yet determined by the appended claims.

The present application claims the priority of the Chinese patent application No. 201510575237.7 submitted on Sep. 10, 2015, and the content disclosed in the above Chinese patent application is incorporated herein by reference as part of the present application.

What is claimed is:

1. An array substrate, comprising:
  a base substrate,
  an organic electroluminescent structure disposed on the base substrate,
  a thin film packaging layer covering the organic electroluminescent structure, and
  an adsorption layer disposed on the thin film packaging layer,
  wherein the adsorption layer comprises an organic material layer and a cathode material layer which are laminated;
  wherein a material of the organic material layer is the same as a material of an organic functional layer in the organic electroluminescent structure; and
  wherein a material of the cathode material layer is the same as a material of a cathode layer in the organic electroluminescent structure.

2. The array substrate according to claim 1, wherein the adsorption layer is configured to adsorb water vapor and oxygen.

3. The array substrate according to claim 1, wherein the organic material layer comprises at least one selected from the group consisting of: oxadiazole and derivatives thereof, triazole and derivatives thereof, rhodamine and derivatives thereof, coumarin and derivatives thereof, 1,8-naphthalimide and derivatives thereof, pyrazoline and derivatives thereof, triphenylamine and derivatives thereof, porphyrin and derivatives thereof, carbazole and derivatives thereof, pyrazine and derivatives thereof, thiazole and derivatives thereof, perylene and derivatives thereof; polyphenylene, polythiophene, polyfluorene, polytriphenylamine and derivatives thereof; polytriphenylamine, polycarbazole, polypyrrole, polyporphyrin and derivatives and copolymers thereof.

4. The array substrate according to claim 1, wherein the cathode material layer comprises at least one selected from the group consisting of: silver (Ag), aluminum (Al), lithium (Li), magnesium (Mg), calcium (Ca) or indium (In).

5. The array substrate according to claim 1, wherein the organic material layer has a thickness of 50 nm to 1000 nm.

6. The array substrate according to claim 1, wherein the cathode material layer has a thickness of 50 nm to 1000 nm.

7. The array substrate according to claim 1, further comprising: an isolation layer for isolating water vapor and oxygen disposed on the adsorption layer.

8. The array substrate according to claim 7, wherein a material of the isolation layer is the same as a material of the thin film packaging layer.

9. The array substrate according to claim 7, wherein the isolation layer has a thickness of 50 nm to 1000 nm.

10. An organic electroluminescent display panel, comprising the array substrate according to claim 1.

11. The organic electroluminescent display panel according to claim 10, wherein the adsorption layer is configured to adsorb water vapor and oxygen.

12. The organic electroluminescent display panel according to claim 10, wherein the adsorption layer comprises an organic material layer and a cathode material layer which are laminated.

13. The organic electroluminescent display panel according to claim 12, wherein a material of the organic material layer is the same as a material of an organic functional layer in the organic electroluminescent structure.

14. The organic electroluminescent display panel according to claim 12, wherein a material of the cathode material layer is the same as a material of a cathode layer in the organic electroluminescent structure.

15. A display apparatus, comprising the organic electroluminescent display panel according to claim 10.

16. The display apparatus according to claim 15, which is a mobile phone, a tablet computer, a TV set, a display, a laptop, a digital photo frame, or a navigator.

* * * * *